US009236417B2

(12) United States Patent
Park

(10) Patent No.: US 9,236,417 B2
(45) Date of Patent: Jan. 12, 2016

(54) 3-DIMENSIONAL STACK MEMORY DEVICE

(71) Applicant: SK hynix Inc., Gyeonggi-do (KR)

(72) Inventor: Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 124 days.

(21) Appl. No.: 13/720,091

(22) Filed: Dec. 19, 2012

(65) Prior Publication Data

US 2014/0054538 A1    Feb. 27, 2014

(30) Foreign Application Priority Data

Aug. 23, 2012 (KR) .......................... 10-2012-0092643

(51) Int. Cl.
*H01L 27/24* (2006.01)
(52) U.S. Cl.
CPC .................................... *H01L 27/249* (2013.01)
(58) Field of Classification Search
CPC ..................................................... H01L 27/249
See application file for complete search history.

(56) References Cited

U.S. PATENT DOCUMENTS

2013/0016555 A1*  1/2013  Kim et al. ..................... 365/163

FOREIGN PATENT DOCUMENTS

KR    1020050091902    9/2005
KR    1020100111798    10/2010

* cited by examiner

*Primary Examiner* — Fernando L Toledo
*Assistant Examiner* — Valerie N Newton
(74) *Attorney, Agent, or Firm* — IP & T Group LLP

(57) ABSTRACT

A 3-dimensional stack memory device includes a semiconductor substrate, a stacked active pattern configured so that a plurality of stripe shape active regions and insulation layers are stacked alternatively over the semiconductor substrate, a gate electrode formed in the stacked active pattern, a source and drain formed at both sides of the gate electrode in each of the plurality of active regions, a bit line formed on one side of the drain to be connected to the drain, a resistive device layer formed on one side of the source to be connected to the source, and a source line connected to the resistive device layer. The source is configured of an impurity region having a first conductivity type, and the drain is configured of an impurity region having a second conductivity type different from the first conductivity type.

12 Claims, 19 Drawing Sheets

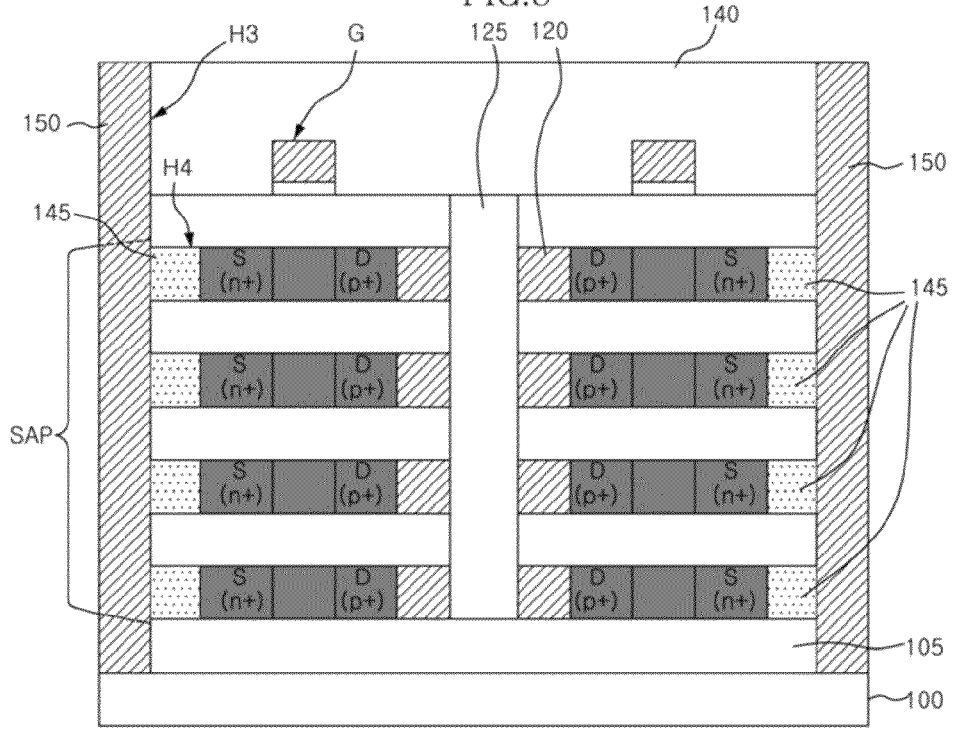
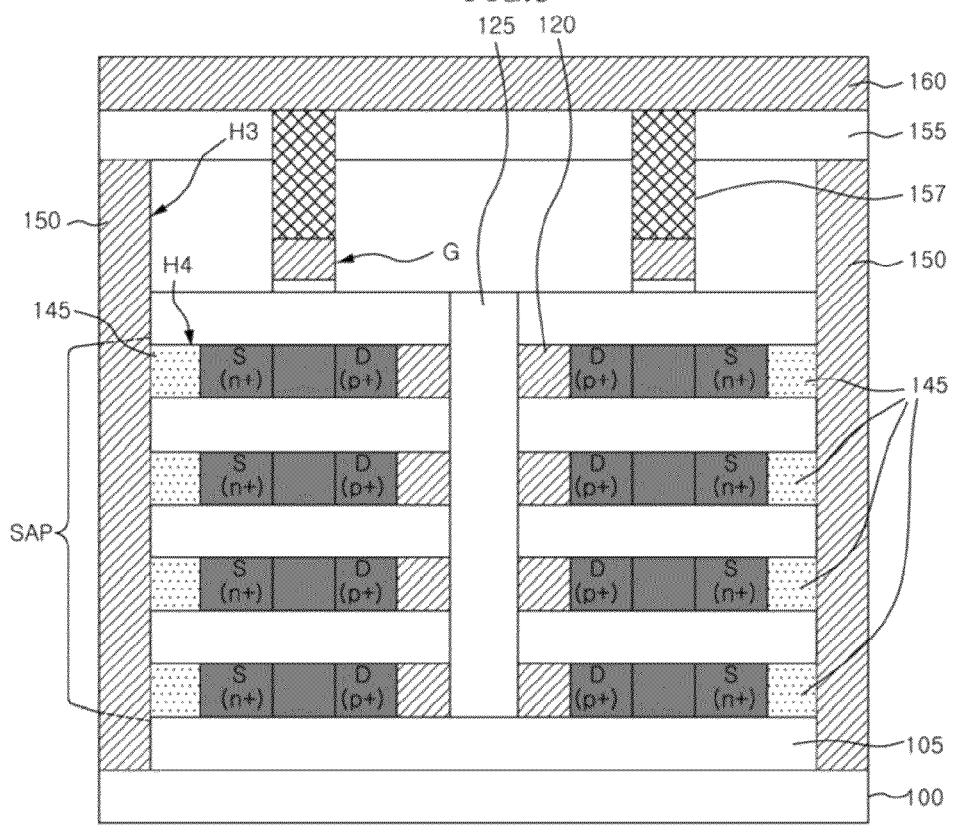

3-DIMENSIONAL STACK MEMORY DEVICE

CROSS-REFERENCES TO RELATED APPLICATION

This application claims priority under 35 U.S.C. 119(a) to Korean application number 10-2012-0092643, filed on Aug. 23 2012, in the Korean Patent Office, which is incorporated by reference in its entirety.

BACKGROUND OF THE INVENTION

1. Technical Field

Exemplary embodiments of the present invention relate to a semiconductor memory device, and more particularly, to a 3-dimensional (3D) stack memory device.

2. Related Art

With the rapid development of mobile and digital information communication and consumer-electronic industry, further improvements upon existing electronic charge devices are expected to encounter the limitation. Thus, new functional memory device other than the existing electronic charge device needs to be developed. In particular, next-generation memory devices with large capacity, ultra-high speed, and ultra-low power consumption need to be developed.

Currently, resistive memory devices using a resistive device as a memory medium have been suggested as the next generation memory devices and there are typically phase change random access memory (PCRAM), resistive RAM (ReRAM), and magentoresistive RAM (MRAM).

The resistive memory device may be basically configured of a switching device and a resistive device and stores data "0" or "1" according to a resistance state.

Even in the resistive memory devices, the first priority is to improve an integration density and to integrate memory cells in a narrow area as many as possible. Furthermore, when the plurality of memory cells are integrated in a limited area, switching performance has to be ensured.

SUMMARY

In accordance with an embodiment of the present invention, the stack memory device may include a semiconductor substrate, a stacked active pattern configured so that a plurality of stripe shape active regions and insulation layers are stacked alternatively over the semiconductor substrate a gate electrode formed in the stacked active pattern, a source and drain formed at both sides of the gate electrode in each of the plurality of active regions, a bit line formed on one side of the drain to be connected to the drain, a resistive device layer formed on one side of the source to be connected to the source, and a source line connected to the resistive device layer. The source may be configured of an impurity region having a first conductivity type, and the drain may be configured of an impurity region having a second conductivity type different from the first conductivity type.

In accordance with another embodiment of the present invention, the stack memory device may include a plurality of switching devices disposed in a stack structure on a semiconductor substrate, a plurality of data transfer lines each connected to one electrode of each of the switching devices disposed in the stack structure, resistive device layers each connected to the other electrode of each of the switching devices disposed in the stack structure, and a source line commonly connected to the resistive device layers. The switching devices may include a tunnel field effect transistor (FET).

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 2 to 9 are cross-sectional views illustrating a method of fabricating a stack memory device according to an exemplary embodiment of the inventive concept;

DETAILED DESCRIPTION

Figure 1:
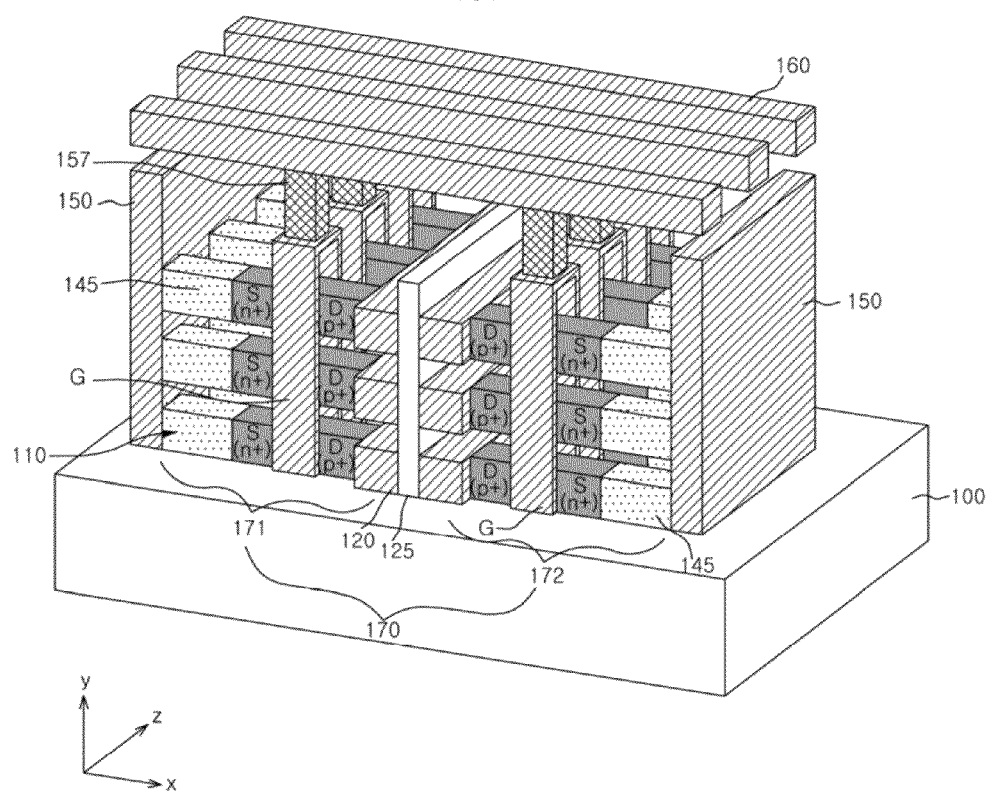
FIG. 1 is a perspective view illustrating a stack memory device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It should be readily understood that the meaning of "on" and "over" in the present disclosure should be interpreted in the broadest manner such that "on" not only means "directly on" something but also include the meaning of "on" something with an intermediate feature or a layer therebetween, and that "over" not only means the meaning of "over" something may also include the meaning it is "over" something with no intermediate feature or layer therebetween (i.e., directly on something).

FIG. 1 is a perspective view illustrating a stack memory device according to an exemplary embodiment of the inventive concept.

Referring to FIG. 1, a plurality of stripe shape active layers 110 are stacked on a semiconductor substrate 100 with insulating layers (not shown) being interposed therebetween. The active layers 110 may extend in an x-direction of FIG. 1 and disposed parallel to each other in a z-direction of FIG. 1 at given intervals. The stacked active layers 110 may divide unit cell regions 170 into unit cell 171 and unit cell 172 with an insulating plug 125 extending perpendicular to a surface of the semiconductor substrate 100 (y-direction). Here, the unit cell region may be referred to as a unit active region and hereinafter, the stacked unit cell regions may be referred to as an active structure connected to one word line.

A gate electrode G is formed on a predetermined portion of the active structure including the stacked unit cell regions cell. A gate insulating layer (not shown) may be interposed between the gate electrode G and the unit cell in each layer, and the gate electrode G may be formed in an alphabet "U" shape to surround sides of the stacked unit cell in a minor axis direction (z-direction) of the unit cell and a top of the uppermost unit cell region among the stacked unit cell regions. The gate electrode G may be electrically connected to a word line 160.

A source S and a drain D are formed in each of the unit cells at both sides of the gate electrode G, and therefore, a transistor is formed in each of the unit cell. A bit line 120 is formed to be connected to the drain D of the transistor, and a resistive device layer 145 is formed to be connected to the source S. At this time the transistor may be a tunnel field effect transistor (FET) in which the source S and the drain D have the different conductivity types from each other to be driven by a tunneling effect of a band gap.

The bit line 120 may extend in the z-direction of FIG. 1 and is commonly connected to drains D of unit cell arranged in parallel in the z-direction and disposed in the same layer (on the same plane). That is, the bit line 120 is disposed substantially perpendicular to the active layer 110 and the word line 160.

The resistive device layer 145 is a storage medium configured to store a signal of the bit line 120 based on a switching operation of the transistor and may include a PrCaMnO (PCMO) layer that is a material for a resistive random access memory (ReRAM), a chalcogenide layer that is a material for a phase-change RAM (PCRAM), a magnetic layer that is a material for a magnetic RAM (MRAM), a magnetization reversal device layer that is a material for a spin-transfer torque MRAM (STTMRAM), or a polymer layer that is a material for a polymer RAM (PoRAM).

The resistive device layers 145 may be connected to a common source line 150, and the common source line 150 may be connected, for example, to a ground voltage terminal. The common source line 150 may have a plate shape extending to the y-direction of FIG. 1 and may be commonly connected to all the resistive device layers 145. In the stack memory device, a plurality of memory cells are integrated in a limited area by the stacked arrangement of the unit cell regions and the bit lines. Furthermore, in the exemplary embodiment, the tunnel FET having a different junction polarity between the source and drain may be used as the transistor to improve the switching performance of the transistor.

FIGS. 2 to 9 are views illustrating a method of fabricating a stack memory device according to an exemplary embodiment of the inventive concept, wherein FIGS. 2 to 9 show an x-y plane of FIG. 1. FIGS. 10 to 17 are views illustrating a method of fabricating a stack memory device according to an exemplary embodiment of the inventive concept, wherein FIGS. 10 to 17 show an x-z plane of FIG. 1. Here, FIGS. 2 to 9 are cross-sectional views taken along line a-a' of FIGS. 10 to 17.

Figure 2:
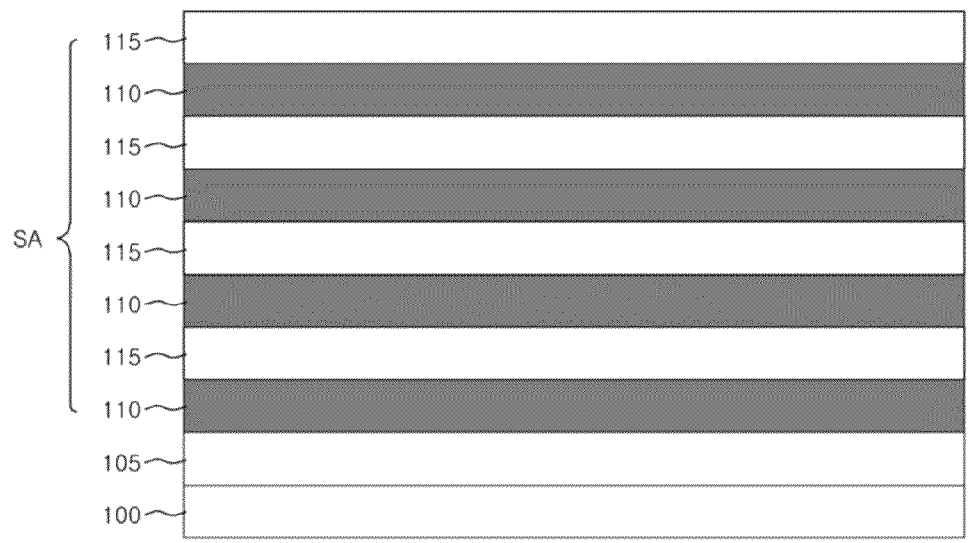
Figure 10:
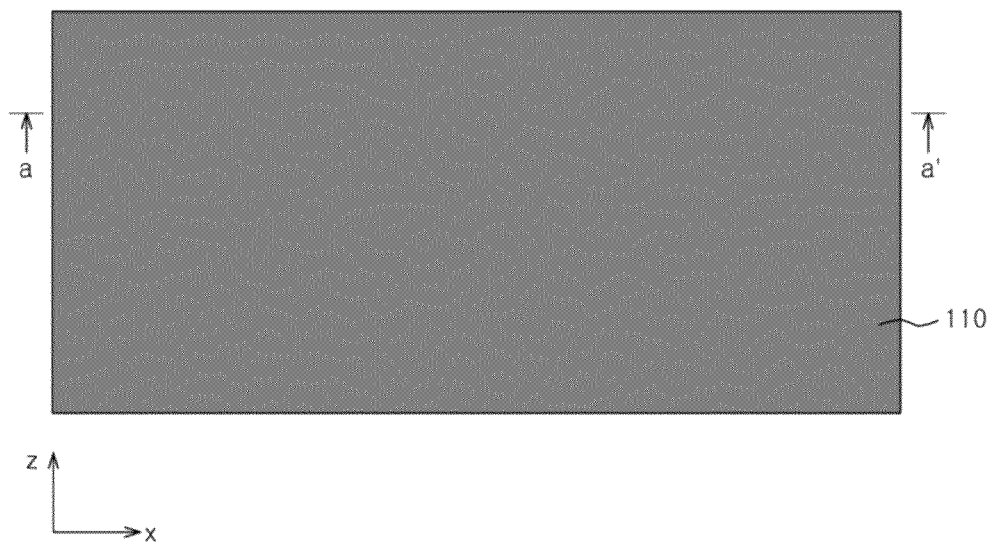
FIGS. 10 to 16 are plan views illustrating a method of fabricating a stack memory device according to an exemplary embodiment of the inventive concept.

Referring to FIGS. 2 and 10, an insulating layer 105 is formed on a semiconductor substrate 100. An active layer 110 and an interlayer insulating layer 115 are alternatively stacked on the insulating layer 105 multiple times to form a stacked active structure SA. The active layer 110 may be a semiconductor layer such as silicon (Si), silicon germanium (SiGe), or gallium arsenide (GaAs) and may be configured of a single layer or a multiple layers. The insulating layer 105 and the interlayer insulating layer 115 may include, for example, a silicon oxide material.

Figure 3:
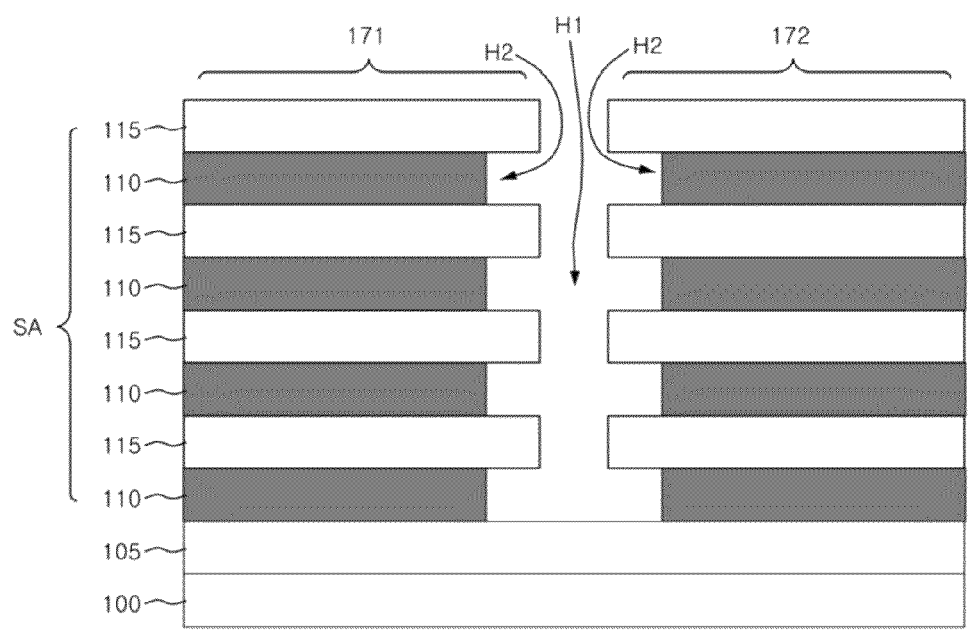
Figure 11:
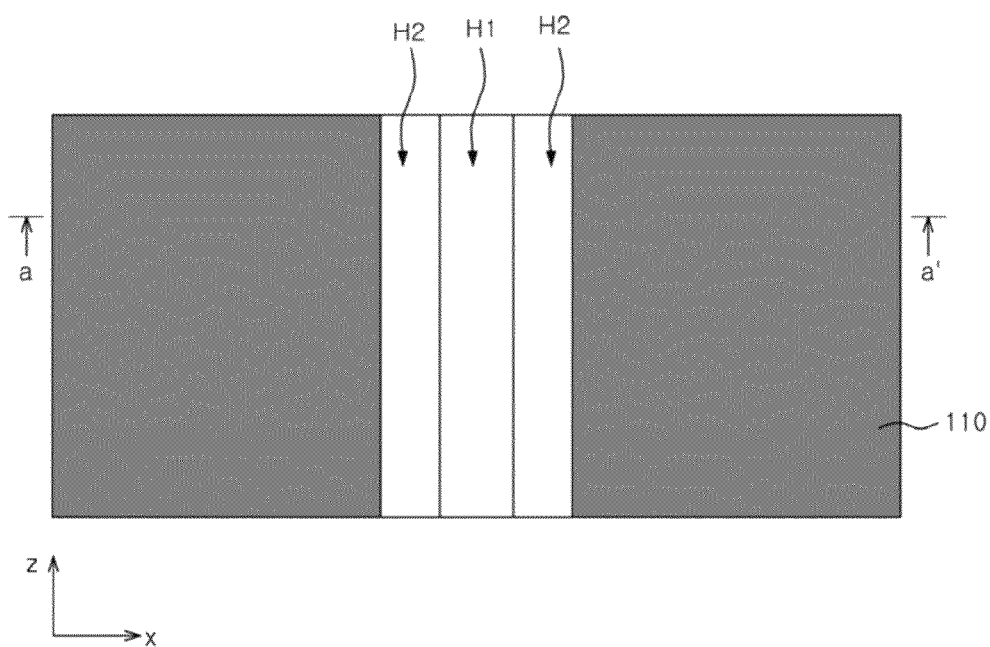

Referring to FIGS. 3 and 11, a predetermined portion of the stacked active structure SA is patterned to expose the insulating layer 105, and therefore a first hole H1 is formed. Subsequently, an etch process is performed to pull back sides of the active layers 110, and the interlayer insulating layers 115 is exposed through the first hole H1 by a predetermined length to form a second hole H2. The first hole H1 is a hole for separating bit lines for cells and the second hole H2 is a hole defining a bit line region. At this time, the stacked active structure SA is divided into the unit cells of the unit cell regions by the first and second holes H1 and H2.

Figure 4:
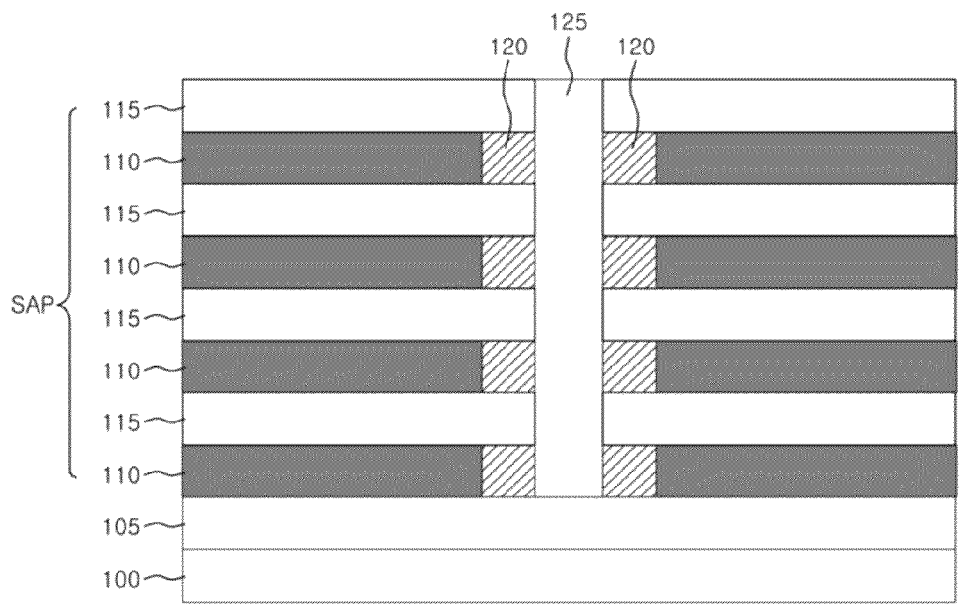
Figure 12:
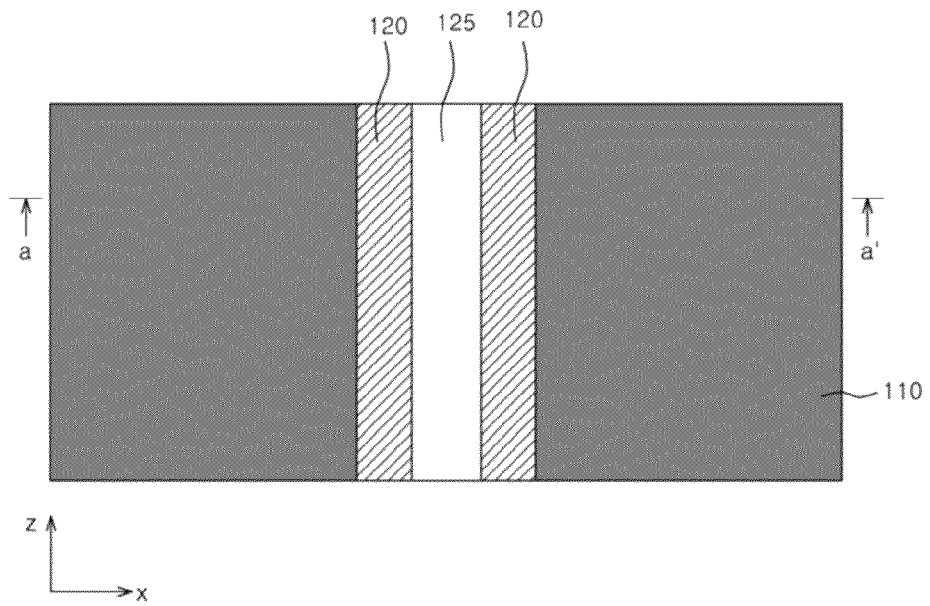

Referring to FIGS. 4 and 12, a conductive material is filled within the second holes H2 to form bit lines 120 which are in contact with the active layers 110. The conductive material for the bit line 120 may include a metal layer such as tungsten (W), copper (Cu) titanium (Ti), molybdenum (Mo), or tantalum (Ta), a metal nitride layer such as titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), or tantalum aluminum nitride (TaAlN), a metal suicide layer such as titanium silicide (TiSi), an alloy metal layer such as Titanium tungsten (TiW), or a metal oxynitride layer such as titanium oxynitride (TON) tungsten oxynitride (WON), or tantalum oxynitride (TaON). Further, each of the bit lines 120 may be commonly connected to drains (D of FIG. 1) located on the same plane. Next, an insulating layer is buried in the first hole H1 to form an insulating plug 125. The bit lines 120 are separated in units of layers by the stacked interlayer insulating layers 115 and the insulating plug 125.

Figure 5:
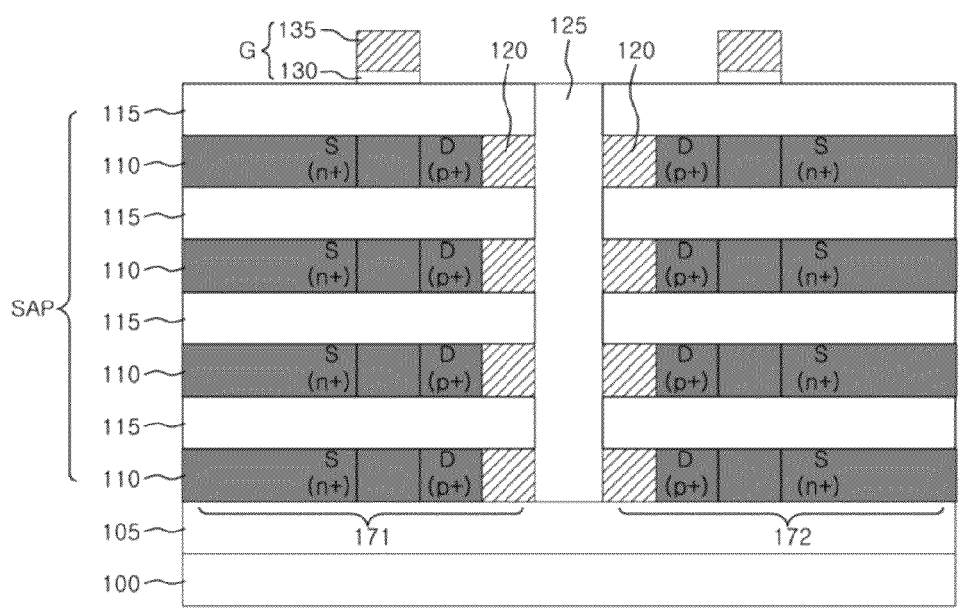
Figure 13:
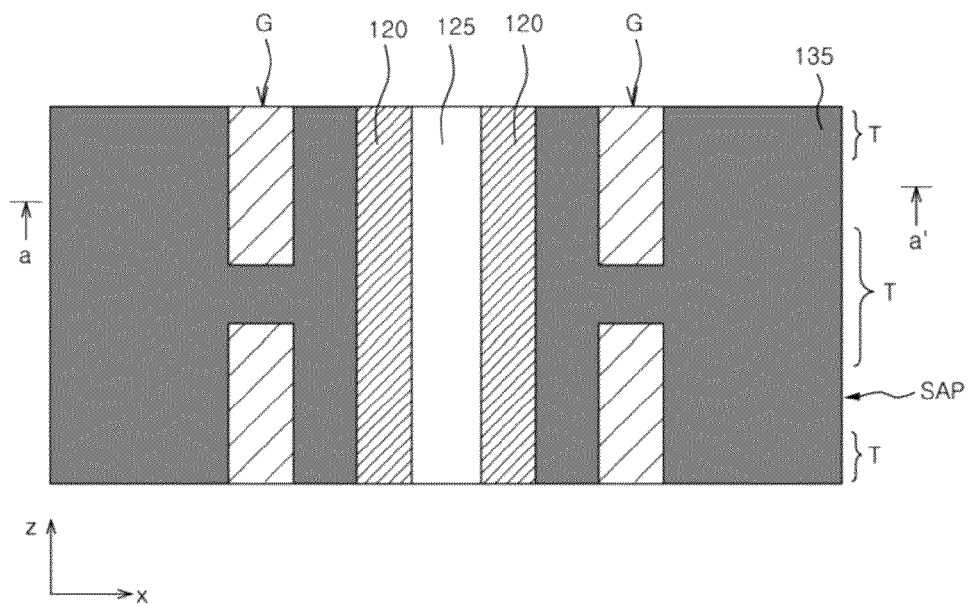

Referring to FIGS. 5 and 13, a predetermined portion T of the stacked active structure SA is etched to define a gate electrode formation region. Therefore, the stacked active structure SA is divided into a plurality of stacked active patterns SAP having a stripe shape extending in an x-direction. Here, the plurality of stacked active patterns SAP may be referred as a plurality of unit cell.

A gate insulating layer 130 and a gate electrode layer 135 are formed on the semiconductor substrate in which the plurality of stacked active patterns SAP are formed. Like the bit line 120, the gate electrode layer 135 may include a metal layer such as W, Cu, Ti, Mo, or Ta, a metal nitride layer such as TiN, TaN, WN, MoN, NbN, TiSiN, TiAlN, TiBN, ZrSiN, WSiN, WBN, ZrAlN, MoSiN, MoAlN, TaSiN, or TaAlN, a metal silicide layer such as TiSi, an alloy metal layer such as TiW, or a metal oxynitride layer such as TiON, WON, or TaON.

Next, the gate electrode layer 135 and the gate insulating layer 130 are etched to surround the stacked active patterns SAP and therefore a gate electrode G is formed. The gate electrode G is formed in each of the stacked active patterns SAP. Although the gate electrode G is arranged in a direction substantially perpendicular to the stacked active pattern SAP when viewed in a plan of FIG. 13, the gate electrode G is formed in a shape surrounding a top and sides of each of the stacked active patterns SAP as shown in FIG. 1. Therefore, one gate electrode G is disposed in one stacked active pattern SAP. Substantially, the gate electrode G serves as a common gate of unit active regions including the stacked active pattern SAP.

A source S and a drain D are formed in each of the active layers 110 using the gate electrode G as a mask. The source S and the drain D are formed in each of the staked active layers 110 through stepwise ion implantation. A portion of each active layer 110, which is in contact with the bit line 120 may be the drain D and the source S, may be formed wider than a width of the drain D.

Figure 6:
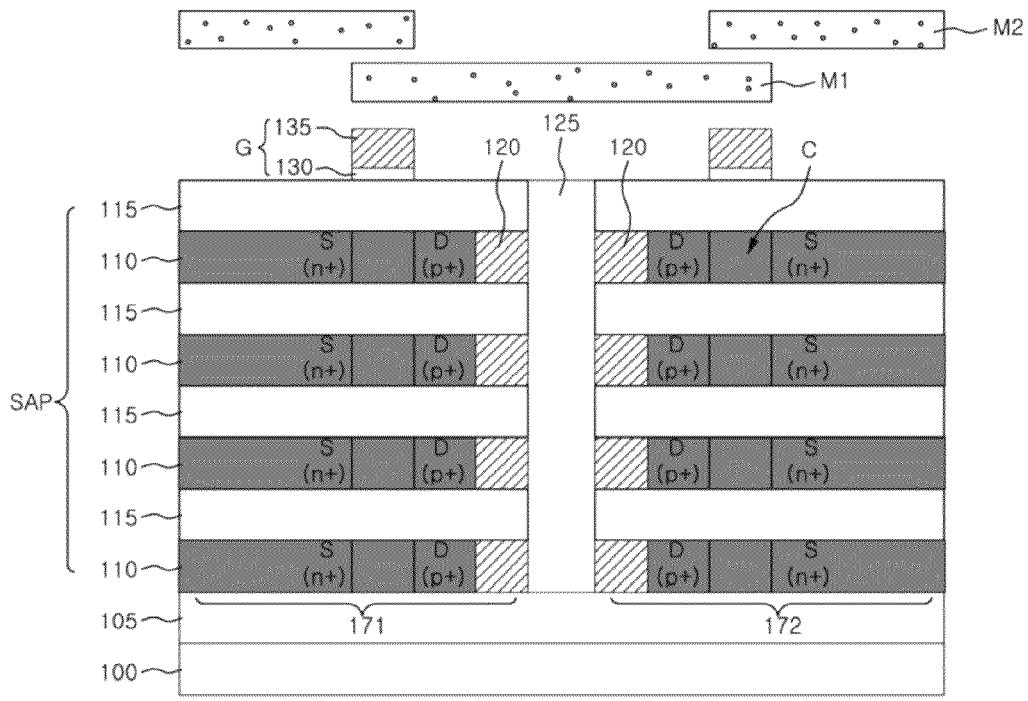

In the exemplary embodiment, since the source S has to be formed to have a different conductivity type from the drain D, the source S and drain D may be selectively formed using a plurality of photo masks M1 and M2 as shown in FIG. 6. That is, when the source S is first formed, the first photo mask M1 is formed on the semiconductor substrate including the gate electrode G, and a high concentration N type impurity is ion-implanted in an exposed region of each of the stacked active layers 110 step-by-step to form the source S(n+) in each of the active layer 110 of each stacked active pattern SAP. Subsequently, the first photo mask M1 is removed through a conventional method. The second photo mask M2 is formed on the semiconductor substrate including the source S(n+). A high concentration P type impurity is ion-implanted in an exposed region of each of the stacked active layers 110 step by step to form the drain D(n+) in each of the active layers 110 of each stacked active pattern SAP. Therefore, a tunnel FET is formed in each of the active layers 110 of the stacked active pattern SAP. At this time, a channel layer C of the tunnel FET may include an intrinsic semiconductor layer, that is, a polysilicon layer in which any impurity is not contained.

Figure 7:
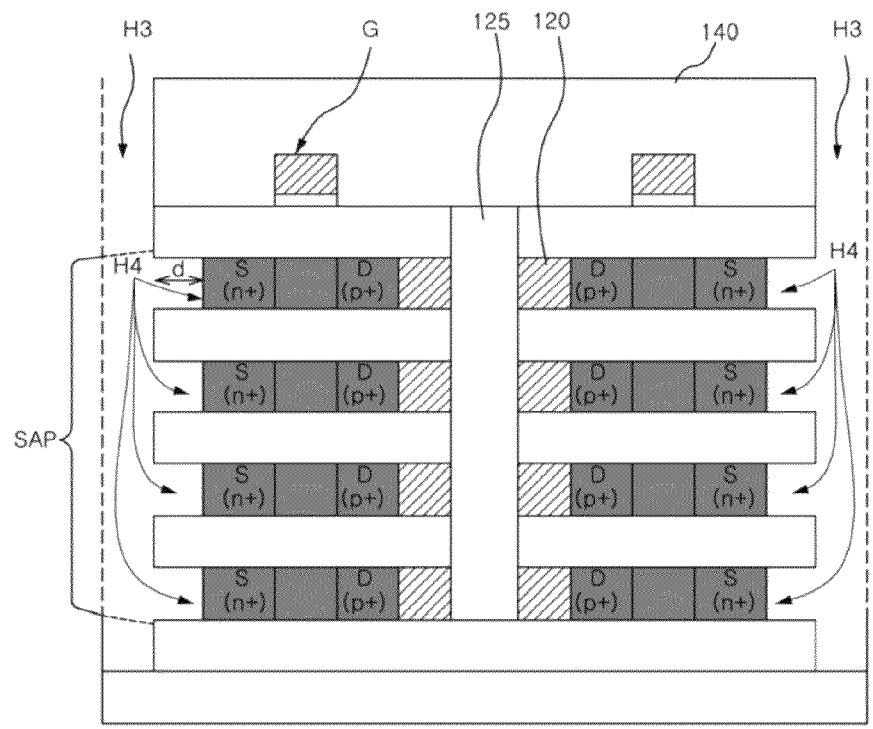
Figure 14:
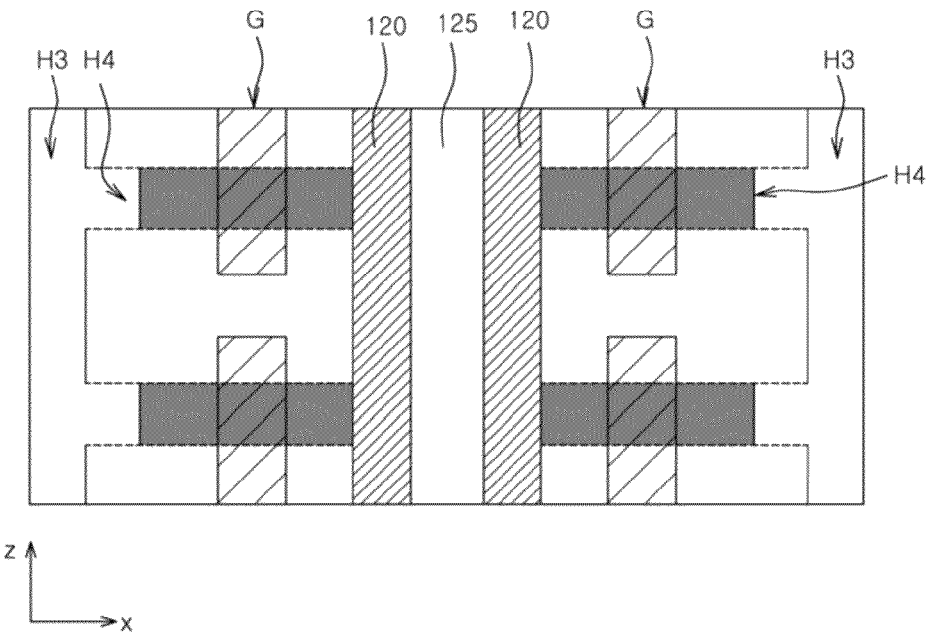

Referring to FIGS. 7 and 14, an upper insulating layer 140 is formed on the semiconductor substrate 100 in which the tunnel FET is formed. Next, the upper insulating layer 140 and the stacked active pattern SAP are etched to expose sidewalls of the sources S of the stacked active pattern SAP, and therefore, a third hole H3 is formed. Portions of the exposed sources S are pulled back by a predetermined length to form a fourth hole H4. Here, a depth d of the fourth hole H4 is determined so that a width of the source S is substantially the same as a width of the drain D.

Figure 15:
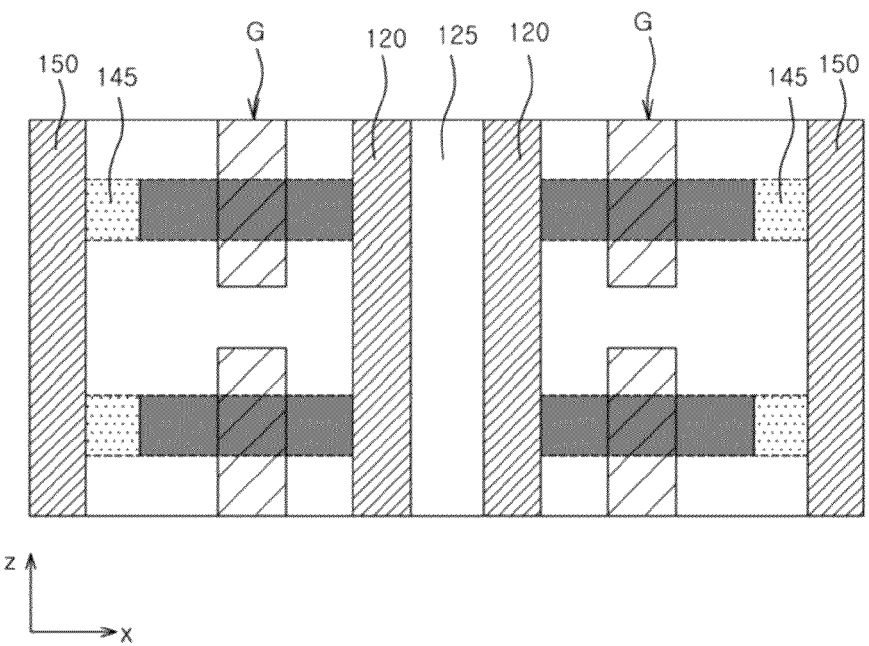

Referring to FIGS. 8 and 15, a resistive material is filled within the fourth hole H4 to form a resistive device layer 145. The resistive device layer 145 may include a PCMO layer that is a material for a ReRAM, a chalcogenide layer that is a material for a PCRAM, a magnetic layer that is a material for a MRAM, a magnetization reversal device layer that is a material for a STTMRAM, or a polymer layer that is a material for a PoRAM. Thus, the source S of each of the stacked active layers 110 in the stacked active pattern SAP is connected to the resistive device layer 145. Next, a conductive material is filled within the third hole H3 to form a common source line 150 commonly connected to the resistive device layers of each stacked active pattern SAP.

Figure 16:
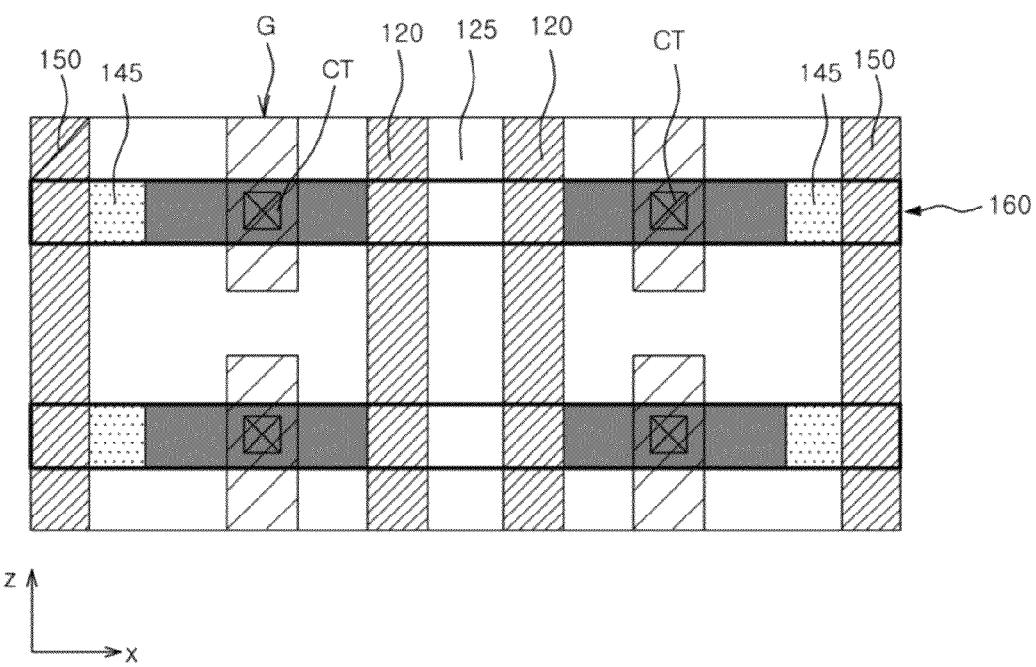

Referring to FIGS. 9 and 16, an interlayer insulating layer 155 is formed on the semiconductor substrate 100 in which the common source line 150 is formed. A conductive plug 157, which is in contact with the gate electrode G, is formed in the interlayer insulating layer 155 and the upper insulating layer 140. Next, a word line 160 is formed on the interlayer insulating layer 155 to be in contact with the conductive plugs 157. The word line 160 may extend in the same direction as an extending direction of the active layer 110. Here, CT of FIG. 16 is a contact CT between the word line 160 and the conductive plug 157.

Figure 17:
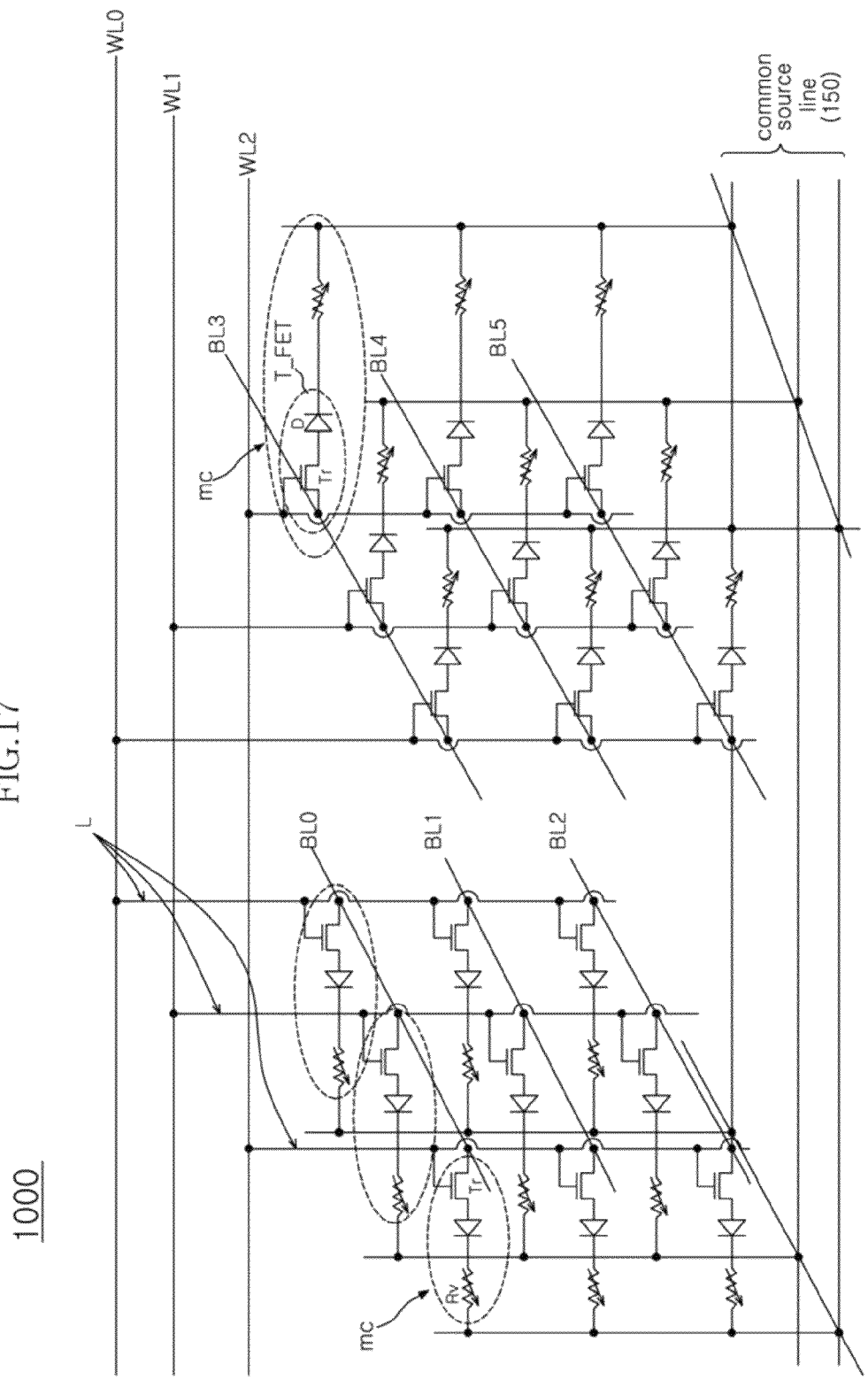
FIG. 17 is a circuit diagram illustrating a stack memory device according to an exemplary embodiment of the inventive concept.

The stack type resistive memory device according to the exemplary embodiment may implement a circuit as shown in FIG. 17.

Referring to FIG. 17, a stack memory device 1000 includes a plurality of word lines WL0, WL1, and WL2, a plurality of bit lines BL0, BL1, and BL2, and a plurality of memory cells mc.

Here, the plurality of bit lines BL0 to BL2 may be stacked, and each of the plurality of word lines WL0 to WL2 may include an interconnection part L extending toward each of the stacked bit lines BL0 to BL2. The interconnection part L may correspond to the contact plug 157 of FIG. 9.

The plurality of memory cells mc are connected between the interconnection parts L extending from the word lines WL0 to WL2 and the bit lines BL0 to BL2. Each of the plurality of memory cells mc may be configured of a tunnel FET T_FET and a variable resistor Rv. The tunnel FET T_FET is implemented with an equivalent circuit of a transistor Tr and a diode D. A gate of the transistor Tr is connected to the interconnection part L, a drain thereof is connected to a corresponding bit line, and a source thereof is connected to the diode D. The diode D is connected to the variable resistor Rv. The variable resistor Rv is connected to a common source line and may correspond to the resistive device layer 145 of the above-described exemplary embodiment. Here, the common source line 150 may be commonly coupled to be connected to a ground voltage terminal (not shown).

A method of driving a selected memory cell in the above-described stack memory device will be described.

Figure 18:
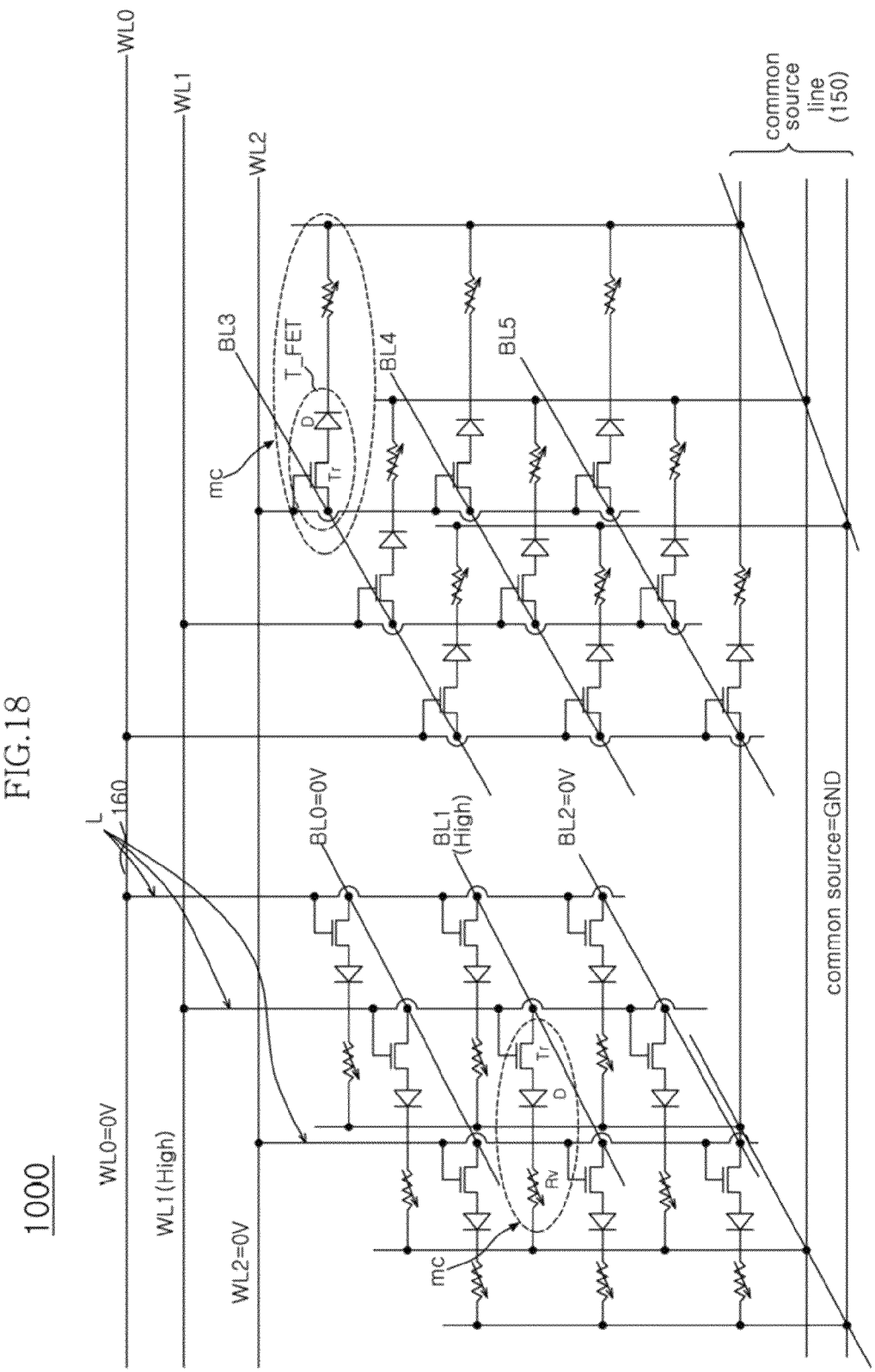
FIG. 18 is a circuit diagram illustrating driving of a stack memory device according to an exemplary embodiment of the inventive concept.

For example, when the tunnel FET is an N type tunnel FET, as shown in FIG. 18, a high voltage (about 1.0 V) is supplied to a selected bit line BL1, and a low voltage (for example, 0.1 V) is supplied to a selected word line WL1. A low voltage (0 V) may be supplied to non-selected bit lines BL0 and BL2 and non-selected word lines WL0 and WL2, or the non-selected bit lines and non-selected word lines may be floating. A ground voltage is supplied to the common source line 150.

In a selected memory cell mc disposed at an interconnection of the selected bit line BL1 and the selected word line WL1, the transistor Tr is turned on by a tunneling effect of the tunnel FET even when the voltage of the word line WL1 is only 0.1 V and current is provided to a variable resistor Rv. Meanwhile, cells connected to the non-selected word lines WL0 and WL2 are not driven due to a reverse bias diode principle.

Figure 19:
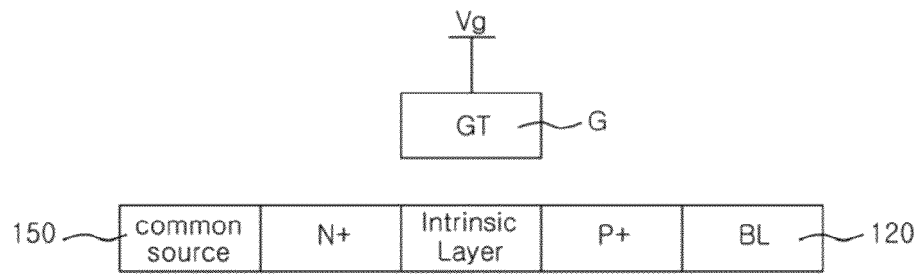
FIG. 19 is a schematic diagram illustrating a tunnel FET according to an exemplary embodiment of the inventive concept.

The operation will be described in detail. In the tunnel FET having the source S and the drain D having different conductivity types from each other illustrated in FIG. 19, when a gate voltage Vg is 0 V and the transistor is turned off, as shown in FIG. 20(*a*), the tunnel FET performs a normal diode operation (normal reverse bias diode operation), and thus, electrons are not migrated.

Figure 20:
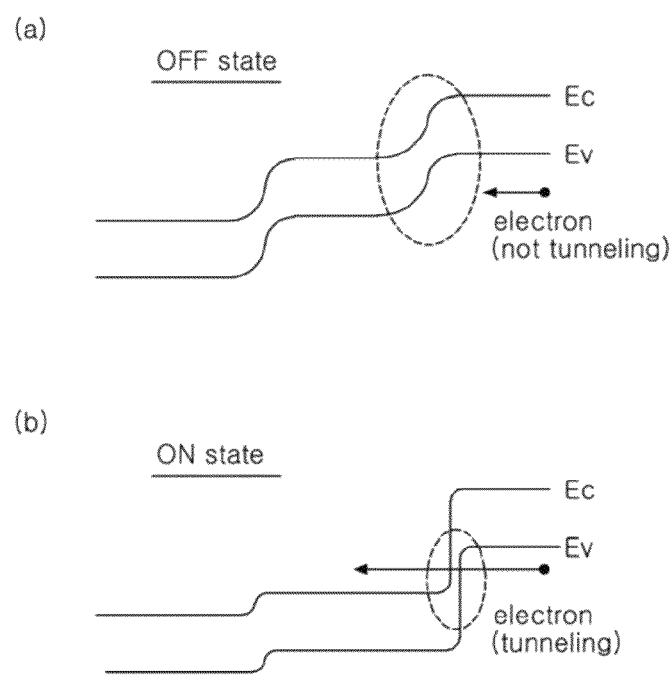
FIG. 20 is an energy band diagram illustrating driving of a tunnel FET according to an exemplary embodiment of the inventive concept.

However, as shown in FIG. 20(*b*), a positive voltage or a negative voltage is supplied as the gate voltage Vg, a band gap in the diode is distorted by the gate voltage. That is, as in FIG. 20(*b*), the band gap between the conduction band Ec and the balance band Ev is rapidly narrow, and thus, electron tunneling is caused by the gate voltage when the voltage between both terminals of the diode (that is, a voltage supplied to the bit line) is low, and thus, a large amount of current is provided through the diode.

Figure 21:
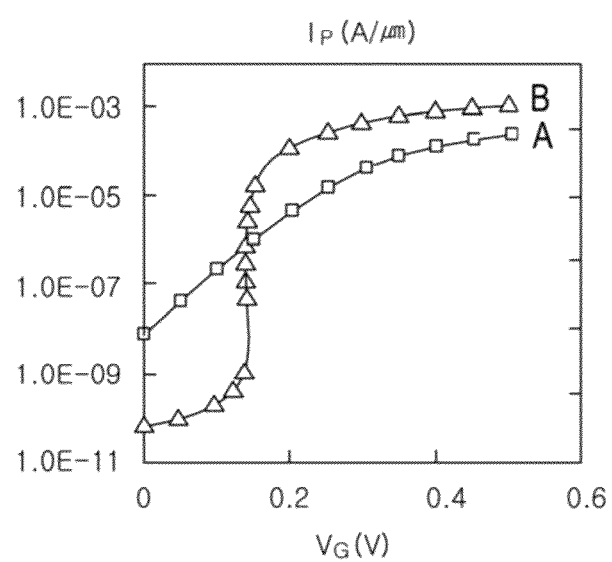
FIG. 21 is a graph illustrating switching performances of a general MOS transistor and a tunnel FET according to an exemplary embodiment of the inventive concept.
Figure 22:
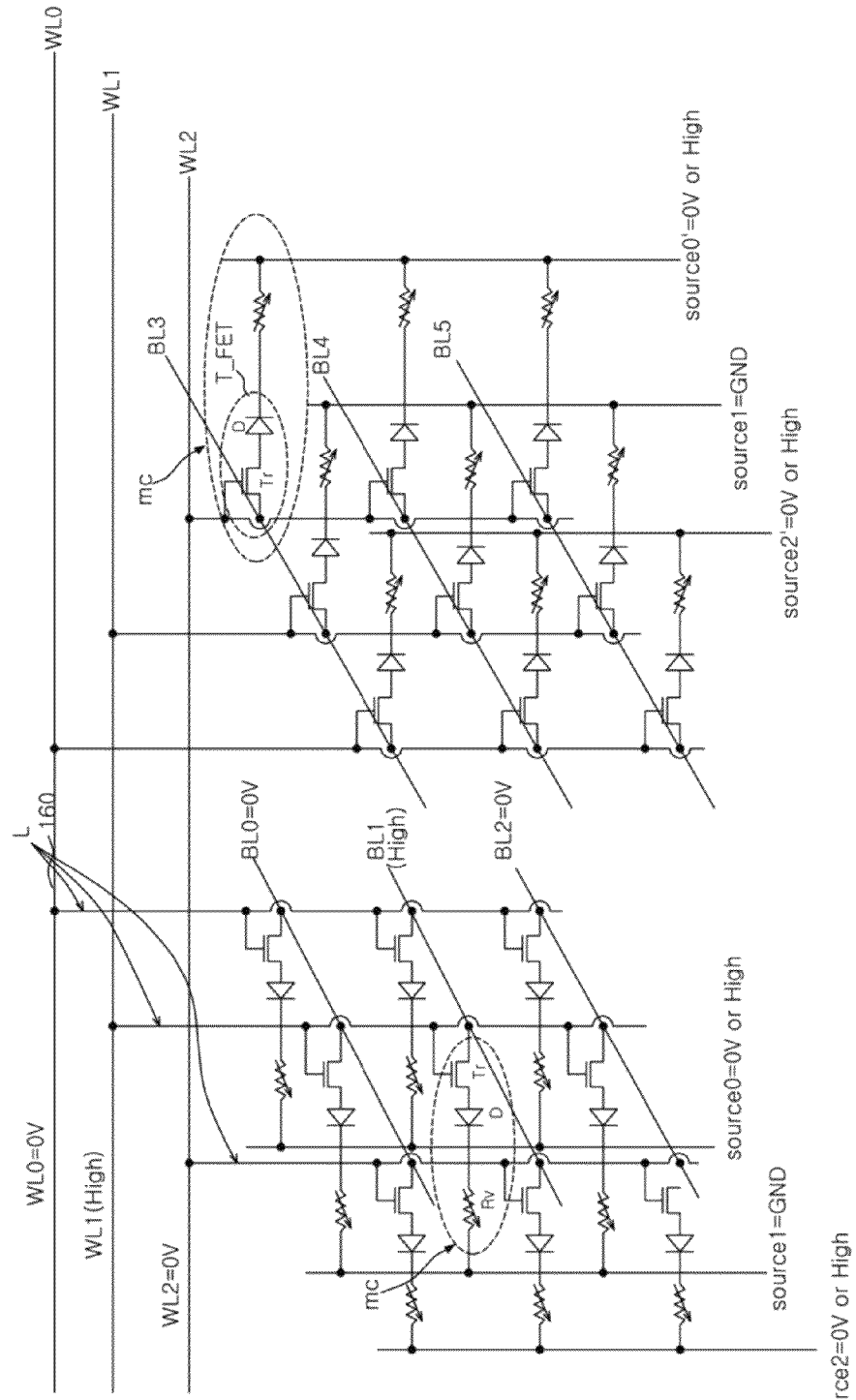
FIG. 22 is a circuit diagram illustrating a stack memory device according to another exemplary embodiment of the inventive concept.

FIG. 21 is a graph showing current characteristics of a general MOS transistor 'A' and a tunnel FET 'B' of the inventive concept. Referring to FIG. 21, the tunnel FET 'B' generating large current switching in a lower voltage range as compared to the general MOS transistor 'A'.

As shown in FIG, 22, a source line may be divided into source lines 'source0', 'source1', and 'source2' other than the common source line 150 illustrated in FIG. 17. In this case, only the source source1 connected to the selected memory cell mc may be connected to a ground voltage terminal (not shown) and 0V or a high voltage may be supplied to the other source lines 'source0 ' and 'source2'. Since the source lines are separately controlled, the concerns regarding leakage current may be improved.

Figure 23:
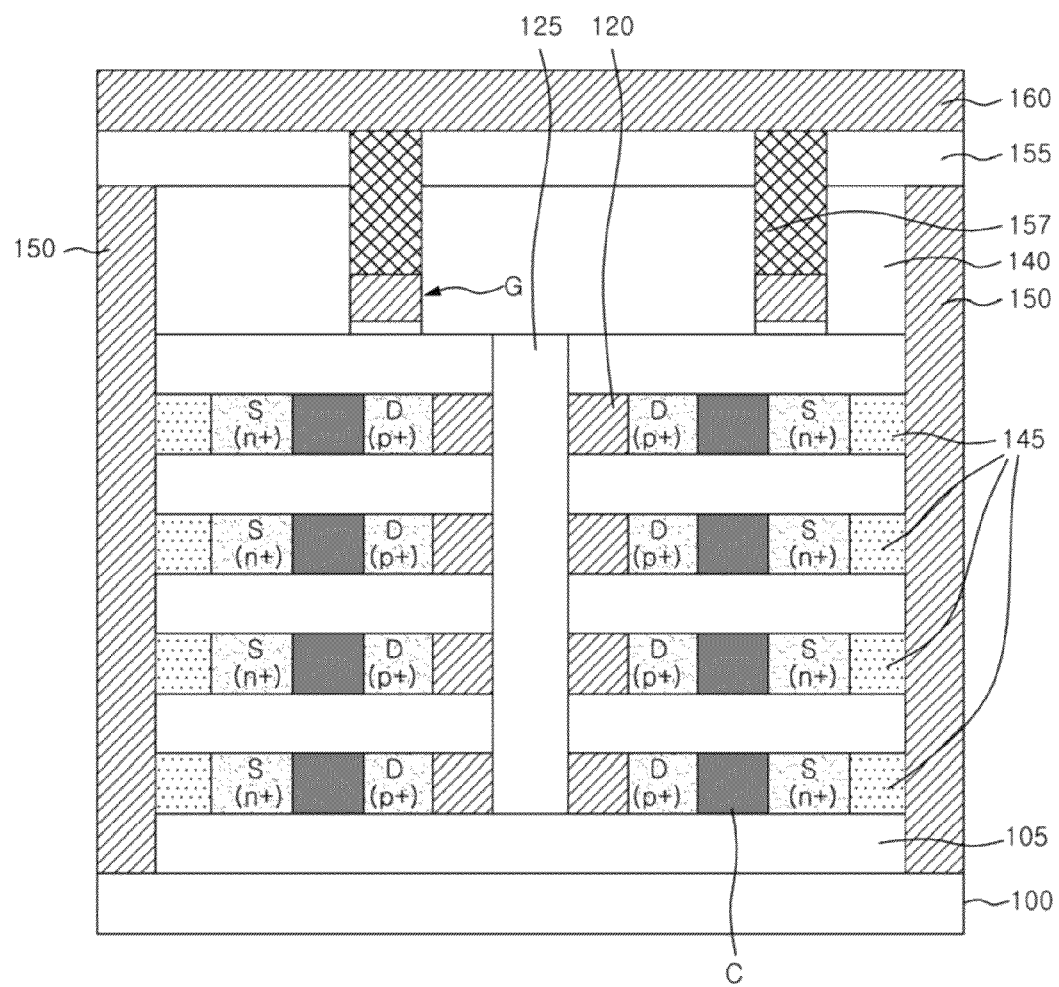
FIGS. 23 to 27 are cross-sectional views illustrating stack memory devices according to other exemplary embodiments of the inventive concept.
Figure 24:
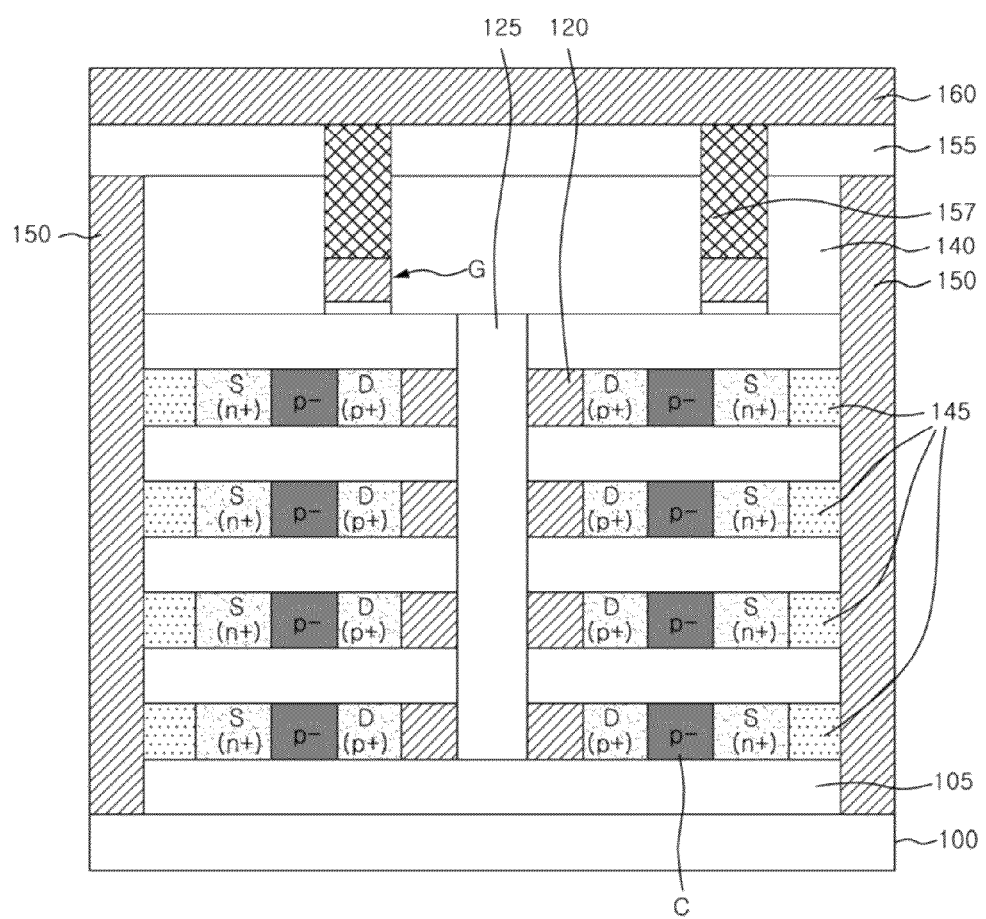

Referring to FIG. 23, a gate electrode G may be located to be biased to the side of the drain having a high concentration P type impurity p+, and thus, distortion of a band gap may be promoted. At this time, as shown in FIG. 24, a channel region 'C' is doped with a low concentration P type impurity p-, and thus, a complete n channel tunnel FET may be implemented.

Figure 25:
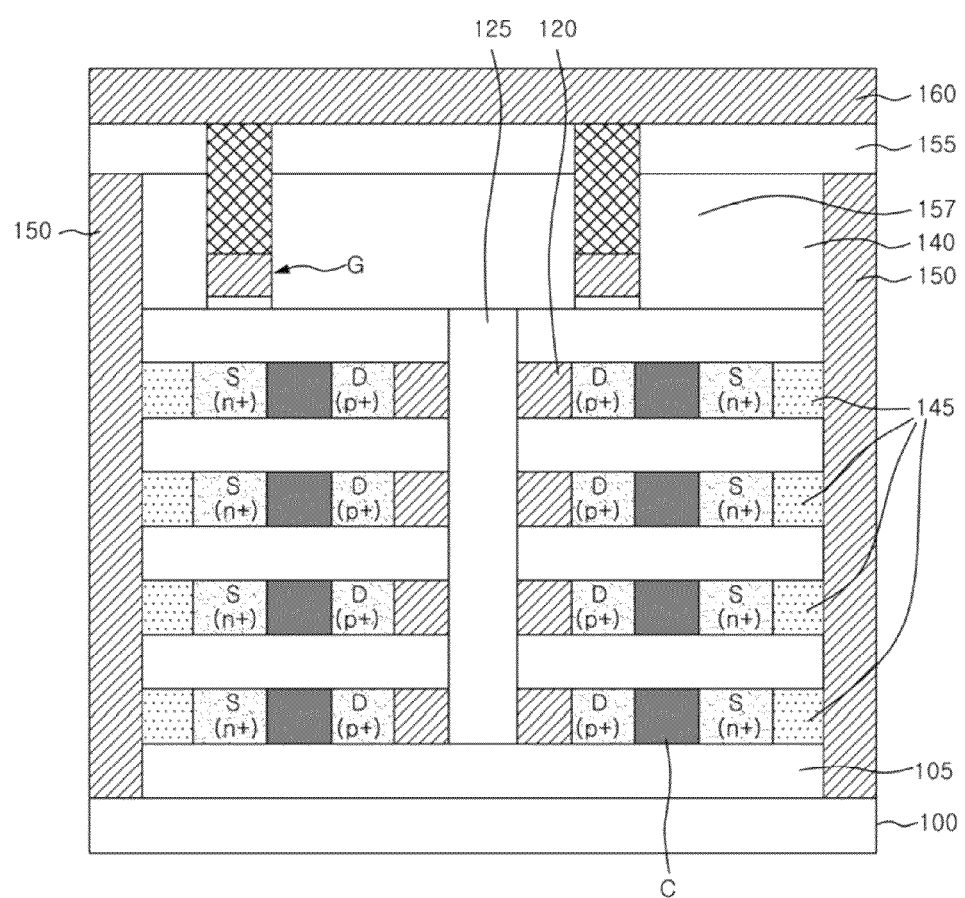
Figure 26:
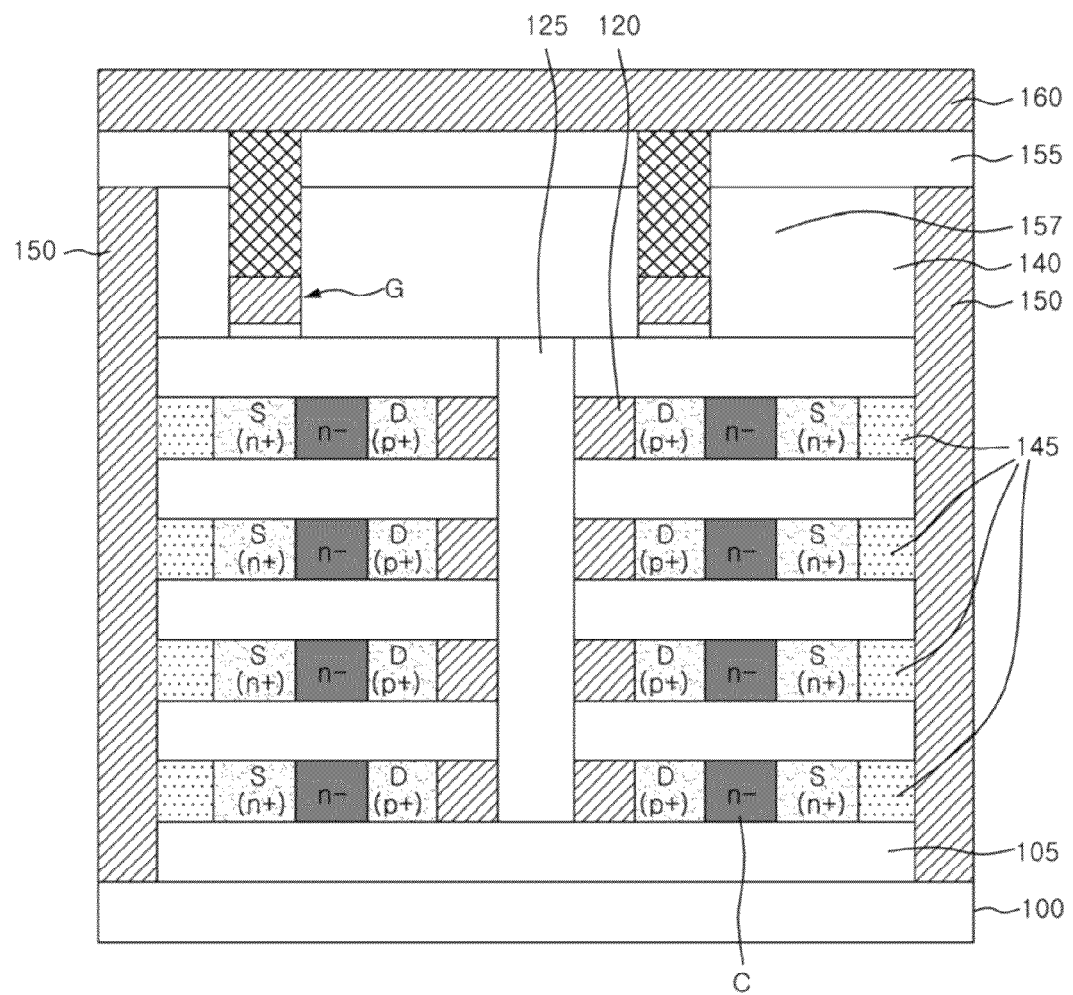

Similarly, as shown in FIG. 25, a gate electrode 'G' may be located to be biased to the side of the source having a high concentration N type impurity n+. At this time, as shown in FIG. 26, a channel region 'C' is doped with a low concentration N type impurity n-, and thus, a complete n channel tunnel FET may be implemented.

Figure 27:
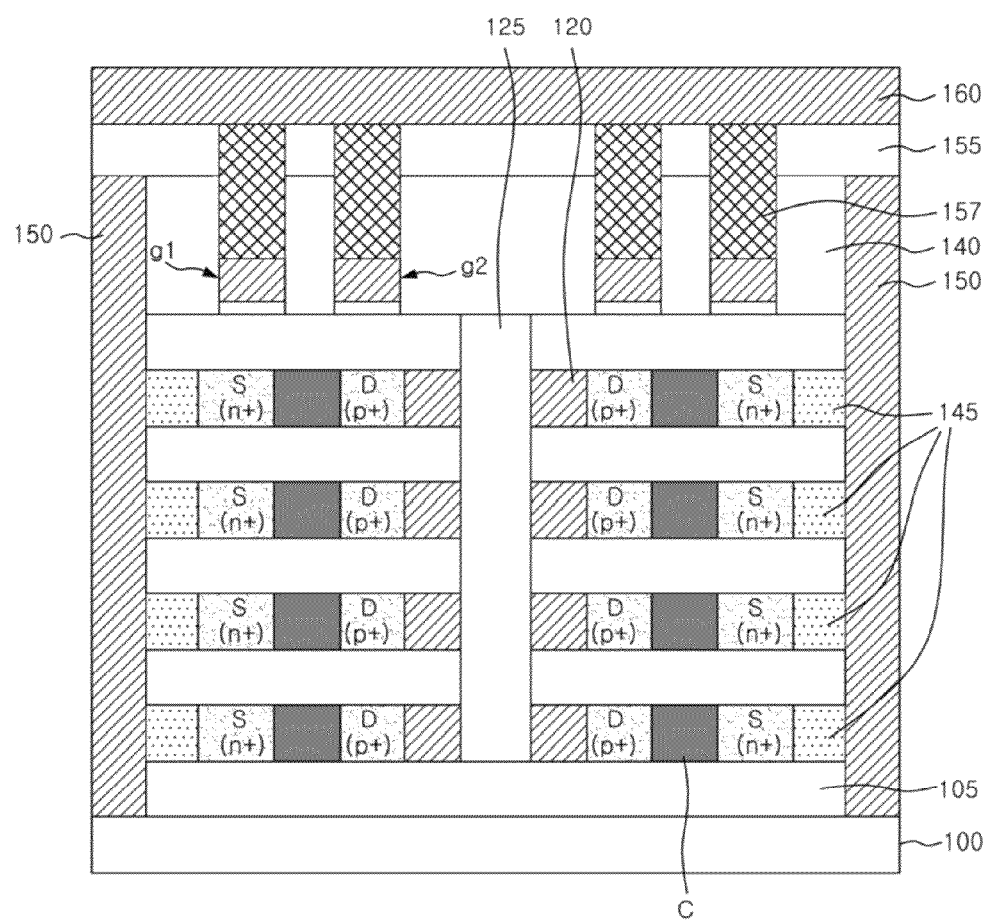

As shown in FIG. 27, two gate electrodes 'g1' and 'g2' may be formed in each unit cell region. Here, the two gate electrodes 'g1' and 'g2' are disposed so that the first gate electrode 'g1' is biased to the side of the source 'S', and the second gate electrode 'g2' is spaced from the first gate electrode 'g1' at a predetermined interval and biased to the side of the drain 'D'. Charge tunneling may be more accurately controlled by the arrangement of the dual gates 'g1' and 'g2'.

In the above-described stack type resistive memory device, a plurality of memory cells are configured in a stacked type through stacking of bit lines, and thus, integration density may improve. Further, a tunnel FET having good switching characteristic even in the low voltage is used as a switching device, and thus, switching performance may be greatly increased.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A stack memory device, comprising:
a semiconductor substrate;
a stacked active pattern configured so that a plurality of stripe shape active regions and insulation layers are stacked alternatively over the semiconductor substrate;
a gate electrode formed in the stacked active pattern;
a source and drain formed at both sides of the gate electrode in each of the plurality of active regions;
a bit line formed on one side of the drain to be connected to the drain;
a resistive device layer formed on one side of the source to be connected to the source; and
a source line connected to the resistive device layer,
wherein the source is configured of an impurity region having a first conductivity type, and the drain is configured of an impurity region having a second conductivity type different from the first conductivity type.

2. The stack memory device of claim 1, wherein each of the plurality of active regions is an intrinsic semiconductor layer.

3. The stack memory device of claim 1, further comprising a word line disposed over the stacked active pattern, connected to the gate electrode, and extending in a first direction.

4. The stack memory device of claim 3, wherein the plurality of stacked active patterns and the plurality of word lines are provided, and
the stacked active pattern and the word line are disposed substantially parallel to each other.

5. The stack memory device of claim 4, wherein the bit line is configured to extend in a second direction substantially perpendicular to the first direction and is commonly connected to the drains of the plurality of active regions disposed on the same plane.

6. The stack memory device of claim 5, wherein the source line is configured to be commonly connected to the resistive device layers of the stacked active pattern, which is disposed substantially parallel in the second direction.

7. The stack memory device of claim 5, wherein the source line is configured to be connected to the resistive device layers of the stacked active pattern.

8. A stack memory device, comprising:
a plurality of switching devices disposed in a stack structure on a semiconductor substrate;
a plurality of bit lines each connected to a first electrode of each of the switching devices disposed in the stack structure;
resistive device layers each connected to a second electrode of each of the switching devices disposed in the stack structure; and
a source line commonly connected to the resistive device layers,
wherein the switching devices include a tunnel field effect transistor (FET).

9. The stack memory device of claim 8, wherein the switching devices include:
a gate electrode formed on portions of a plurality of active regions;
drains formed at a first side of the gate electrode in the plurality of active regions, as the first electrode; and
sources formed at a second side of the gate electrode in the plurality of active regions, as the second electrode.

10. The stack memory device of claim 9, wherein the gate electrode is configured to be disposed on a top of an uppermost active region of the plurality of active regions and sides of the plurality of active regions.

11. The stack memory device of claim 9, wherein the drain and the source have different conductivity types from each other.

12. The stack memory device of claim 11, wherein each of the plurality of active regions between the source and drain is an intrinsic semiconductor layer.

* * * * *